(12) United States Patent
Lee et al.

(10) Patent No.: US 8,269,330 B1
(45) Date of Patent: Sep. 18, 2012

(54) MOSFET PAIR WITH STACK CAPACITOR AND MANUFACTURING METHOD THEREOF

(75) Inventors: Han-Hsiang Lee, Taipei (TW); Yi-Cheng Lin, Pingtung County (TW); Da-Jung Chen, Taoyuan County (TW)

(73) Assignee: Cyntec Co., Ltd., Hsinchu (TW)

( * ) Notice: Subject to any disclaimer, the term of this patent is extended or adjusted under 35 U.S.C. 154(b) by 0 days.

(21) Appl. No.: 13/092,163

(22) Filed: Apr. 22, 2011

(51) Int. Cl.
*H01L 23/02* (2006.01)

(52) U.S. Cl. ........ 257/686; 257/306; 257/341; 257/401; 257/692; 438/25

(58) Field of Classification Search .................. 257/306, 257/341, 401, 686, 692; 438/25
See application file for complete search history.

(56) References Cited

U.S. PATENT DOCUMENTS

| | | | |
|---|---|---|---|
| 2005/0280163 A1* | 12/2005 | Schaffer et al. | 257/778 |
| 2008/0017907 A1* | 1/2008 | Otremba | 257/306 |

OTHER PUBLICATIONS

A System-in-Package (SIP) With Mounted Input Capacitors for Reduced Parasitic Inductances in a Voltage Regulator (Takayuki Hashimoto, Member, IEEE, Tetsuya Kawashima, TomoakiUno, Noboru Akiyama, Member, IEEE, Nobuyoshi Matsuura, and Hirofumi Akagi, Fellow, IEEE) ; Mar. 2010.

* cited by examiner

*Primary Examiner* — Tan N Tran
(74) *Attorney, Agent, or Firm* — Litron Patent & Trademark Office; Min-Lee Teng

(57) ABSTRACT

A MOSFET pair with a stack capacitor is disclosed herein. It can regulate the input voltage and optimize a short EMI loop. It has a bottom lead frame and an up lead frame, which can simultaneously dissipate the heat generated by two MOSFETs to achieve excellent thermal-dissipation. It can adopt solder, Ag epoxy, or gold balls to implement the electrical bonding of two MOSFETs with the bottom lead frame and the up lead frame to achieve excellent structural flexibility. A device, such as an IGBT, a diode, an inductor, a choke, and a heat sink, can be stacked above the up lead frame to form a powerful SiP module. A corresponding method of manufacturing the MOSFET pair with a stack capacitor is also disclosed herein, which is simple, time-saving, flexible, cost-effective, and facile.

29 Claims, 6 Drawing Sheets

MOSFET PAIR WITH STACK CAPACITOR AND MANUFACTURING METHOD THEREOF

BACKGROUND OF THE INVENTION

1. Field of the Invention

The present invention relates to a MOSFET pair with a stack capacitor and the manufacturing method thereof, and more particularly, to which can regulate the input voltage and optimize a short EMI loop.

2. Description of the Prior Art

Along with the rapid progress of the computer and internet communication during the recent years, the switching power supply is widely applied in the information and communication equipments including personal computers, servers, and routers, etc. . . . . It is well known that a pair of MOSFET is common used as the voltage regulator in the switching power supply.

Please refer to FIG. 1, which is a schematic circuit diagram to demonstrate the operation of the MOSFET pair. It contains two MOSFETs, a first MOSFET 10 and a second MOSFET 20, as shown in FIG. 1, the drain of the first MOSFET 10 and the source of the second MOSFET 20 are electrically connected. The first MOSFET 10 and the second MOSFET 20 will regulate the input voltage from the voltage source $V_{in}$, and output to an output capacitor $C_{out}$ and a device 30, such as a microprocessor through a coupling inductor $L_{out}$. Because the switching power supply has developed towards to the high-frequency range presently and there is much parasitic inductance in the circuit of FIG. 1, the Electromagnetic Interference (EMI) has become a serious problem needed to be overcome. Conventionally, there are several techniques has been adopted to tackle the EMI problem. A simple way is utilizing the package technique, for example, the technique of wire-free bonding to reduce the parasitic inductance. However, its improvement is very limited.

Please continuously refer to FIG. 1, another conventional technique is connecting an input capacitor $C_{in}$ to decouple the EMI. However, additional parasitic inductance will be produced if the input capacitor $C_{in}$ is mounted on a Printed Circuit Board (PCB). Therefore, it is not an optimized way to minimize the EMI loop.

Another conventional technique to solve the EMI problem is integrating the input capacitor $C_{in}$ with the MOSFET pair to form a module. Please refer to FIG. 2, which is a cross-sectional schematic diagram to demonstrate the structure of a conventional MOSFET module 100. The module 100 has a pair of MOSFET, a first MOSFET 40 and a second MOSFET 50, which are mounted side by side between a bottom lead frame 60 and a copper plate 70. And, the first MOSFET 40 and the second MOSFET 50 are electrically connected with the bottom lead frame 60 and the copper plate 70 respectively. An input capacitor 80 is mounted on the copper plate 70, such that it is electrically connected with the first MOSFET 40 and the second MOSFET 50 respectively via the copper plate 70. Accordingly, the module 100 can form a short EMI loop; therefore it is more effective to suppress the EMI comparing to other techniques discussed previously.

Nevertheless, the structure of the module 100 has several disadvantages which include: a. The connecting point of the copper plate 70 and the bottom lead frame 60 will induce an impedance to degrade the module performance; and b. The thermal-dissipation ability of the module 100 is limited because it can just dissipate the heat through the bottom lead frame 60 when mounting on a PCB.

Consequently, the present invention proposes a module, which has a pair of MOSFET and an input capacitor stacked on an up lead frame, to overcome the above mentioned problems and disadvantages.

SUMMARY OF THE INVENTION

In order to solve the aforementioned problems, one object of the present invention is to provide a pair of MOSFET and an input capacitor stacked on an up lead frame, and so as to resolve the high inner impedance and low thermal-dissipation ability of the conventional voltage regulation module.

One object of the present invention is to provide a MOSFET pair with a stack capacitor, in which the input capacitor is directly mounted on the up lead frame; so it may avoid the parasitic inductance caused by the PCB.

One object of the present invention is to provide a MOSFET pair with a stack capacitor, in which the input capacitor is directly mounted on the up lead frame, so it may optimize a short EMI loop.

One object of the present invention is to provide a MOSFET pair with a stack capacitor, which has a bottom lead frame and an up lead frame, so that the thermal-dissipation ability of the module is excellent because the heat generated by two MOSFETs can simultaneously dissipate from the bottom lead frame and the up lead frame.

One object of the present invention is to provide a MOSFET pair with a stack capacitor, in which a device, such as an Insulated Gate Bipolar Transistor (IGBT), a diode, an inductor, a choke, and a heat sink, can be stacked above the up lead frame to form a more powerful module of the System in Package (SiP).

One object of the present invention is to provide a MOSFET pair with a stack capacitor, which is wire-free bonding. Therefore, it may avoid the parasitic inductance caused by the bonding wires.

One object of the present invention is to provide a MOSFET pair with a stack capacitor, which can adopt solder, Ag epoxy, or gold balls to implement the electrical bonding of two MOSFETs with the bottom lead frame and the up lead frame. Therefore, it can make the structure and the manufacturing method of the module have excellent flexibility.

One object of the present invention is to provide a method of manufacturing a MOSFET pair with a stack capacitor, which method is simple, time-saving, flexible, cost-effective, and facile.

To achieve the above-mentioned objects, one embodiment of the present invention is to provide a MOSFET pair with a stack capacitor, which comprises: a bottom lead frame having a up surface; an up lead frame having a platform, and a plurality of outer leads, wherein the platform has an inner surface and an outer surface; a first MOSFET mounted between the inner surface of the up lead frame and the up surface of the bottom lead frame, wherein the first MOSFET has a first source electrode, a first drain electrode, and a first gate electrode, in which the first source electrode and the first gate electrode are electrically connected with the up lead frame respectively, and the first drain electrode is electrically connected with the bottom lead frame; a second MOSFET mounted between the inner surface of the up lead frame and the up surface of the bottom lead frame, wherein the second MOSFET is mounted besides the first MOSFET, and the second MOSFET has a second source electrode, a second drain electrode, and a second gate electrode, in which the second source electrode and the second gate electrode are electrically connected with the bottom lead frame respectively, and the second drain electrode is electrically connected with the up lead frame; and a capacitor mounted on the outer surface of the up lead frame, in which the capacitor has a first capacitor electrode and a second capacitor electrode electrically connected with the up lead frame respectively, wherein the first source electrode and the second drain electrode are electrically connected with the second capacitor electrode and the first capacitor electrode respectively via the up lead frame.

To achieve the above-mentioned objects, another embodiment of the present invention is to provide a method of manufacturing a MOSFET pair with a stack capacitor, which comprises: providing a bottom lead frame which has an up surface; providing an up lead frame which has a platform, and a plurality of outer leads, wherein the platform has an inner surface and an outer surface; bonding a first MOSFET on the up surface of the bottom lead frame; bonding a second MOSFET on the inner surface of the up lead frame; flipping the up lead frame to make the inner surface of the up lead frame face onto the up surface of the bottom lead frame; bonding the first MOSFET with the up lead frame; bonding the second MOSFET with the bottom lead frame; and bonding a capacitor on the outer surface of the up lead frame.

Other objects, technical contents, features and advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The detailed explanation of the present invention is described as following. The described preferred embodiments are presented for purposes of illustrations and description, and they are not intended to limit the scope of the present invention.

Figure 1:
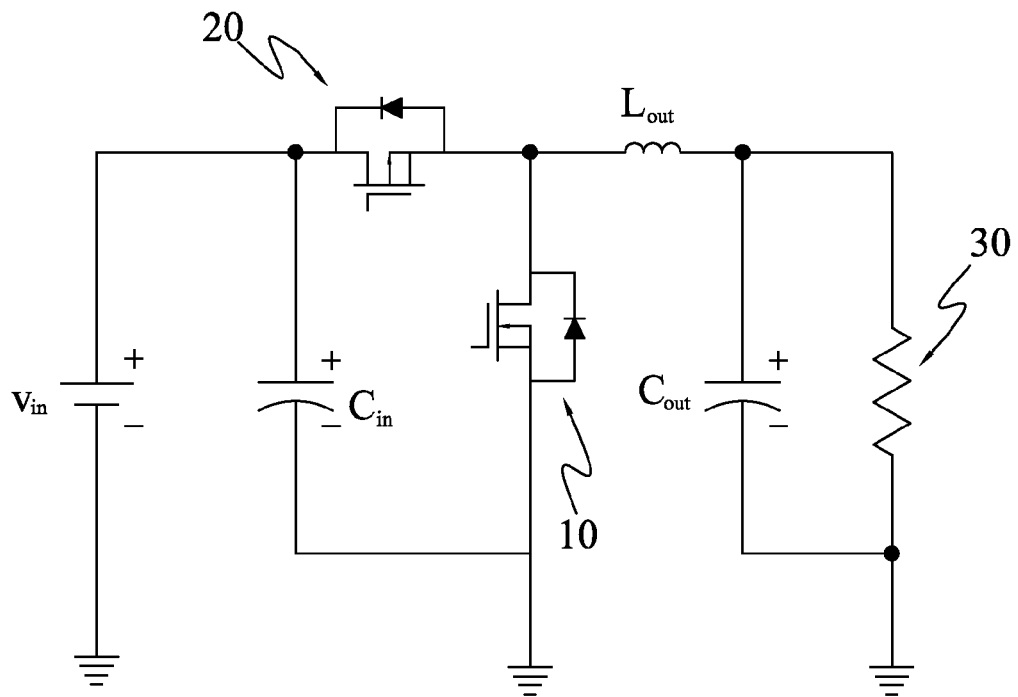
FIG. 1 is a schematic circuit diagram to demonstrate the operation of the MOSFET pair.
Figure 2:
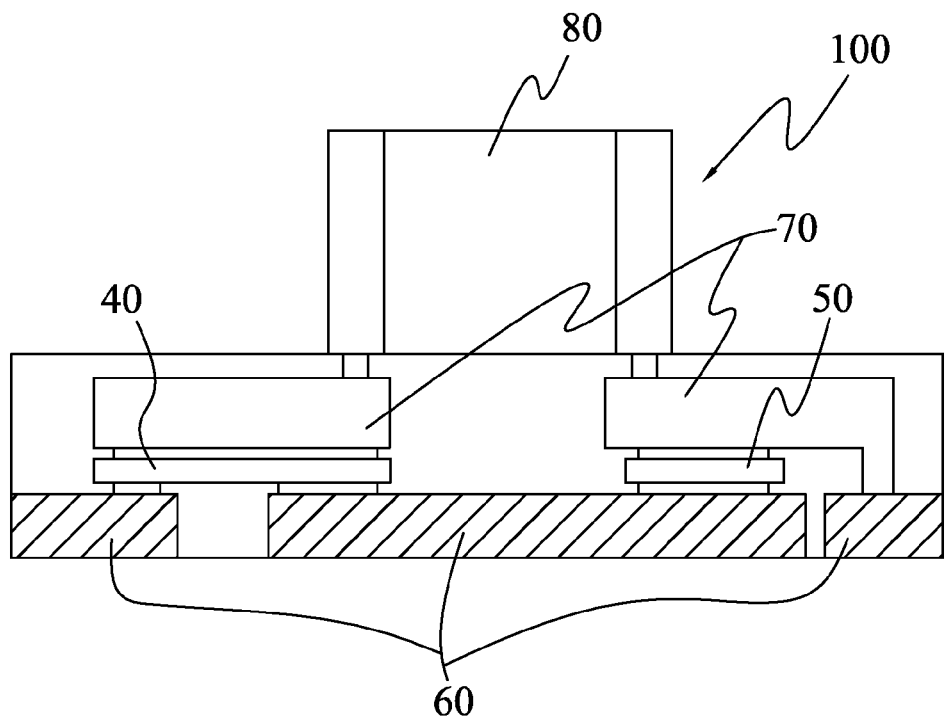
FIG. 2 is a cross-sectional schematic diagram to demonstrate the structure of a conventional MOSFET module.
Figure 3:
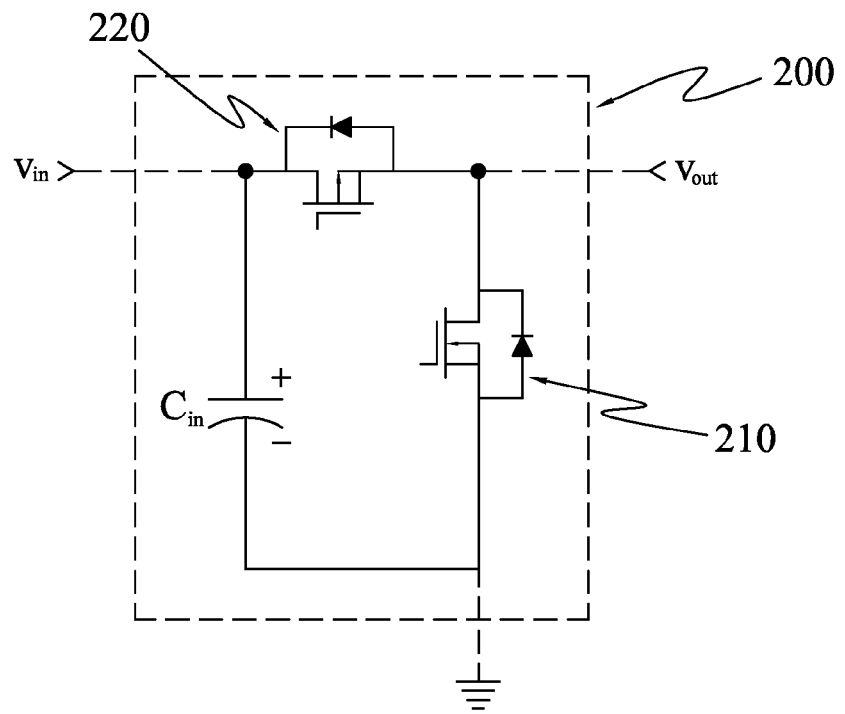
FIG. 3 is a schematic circuit diagram of the present invention.

Firstly, please refer to FIG. 3, which is a schematic circuit diagram of the present invention. A MOSFET pair with a stack capacitor 200 has a first MOSFET 210, a second MOSFET 220, and a capacitor $C_{in}$. The MOSFET pair with a stack capacitor 200 receives an input voltage $V_{in}$ from a voltage source (not shown in FIG. 3) and output an output voltage $V_{out}$ to a device (not shown in FIG. 3).

Figure 4:
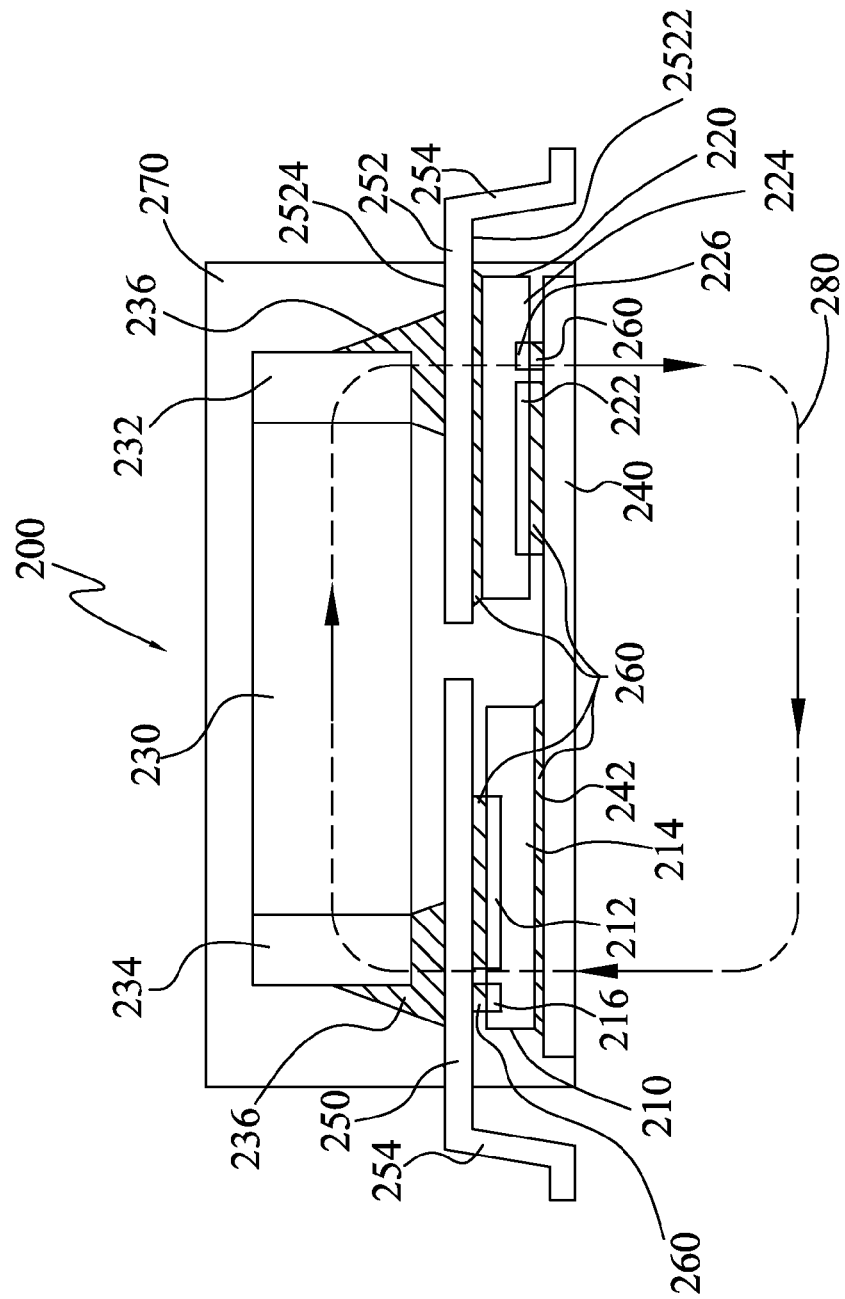
FIG. 4 is a cross-sectional schematic diagram to demonstrate the structure of the first embodiment of the present invention.

Then, please simultaneously refer to FIG. 4, which is a cross-sectional schematic diagram to demonstrate the structure of the first embodiment of the present invention, which its electrical circuit diagram is corresponding to FIG. 3. The MOSFET pair with a stack capacitor 200, comprises: a bottom lead frame 240 having a up surface 242; an up lead frame 250 having a platform 252, and a plurality of outer leads 254, wherein the platform 252 has an inner surface 2522 and an outer surface 2524; a first MOSFET 210 mounted between the inner surface 2522 of the up lead frame 250 and the up surface 242 of the bottom lead frame 240, wherein the first MOSFET 210 has a first source electrode 212, a first drain electrode 214, and a first gate electrode 216, in which the first source electrode 212 and the first gate electrode 216 are electrically connected with the up lead frame 250 respectively, and the first drain electrode 214 is electrically connected with the bottom lead frame 240; a second MOSFET 220 mounted between the inner surface 2522 of the up lead frame 250 and the up surface 242 of the bottom lead frame 240, wherein the second MOSFET 220 is mounted besides the first MOSFET 210, and the second MOSFET 220 has a second source electrode 222, a second drain electrode 224, and a second gate electrode 226, in which the second source electrode 222 and the second gate electrode 226 are electrically connected with the bottom lead frame 240 respectively, and the second drain electrode 224 is electrically connected with the up lead frame 250; and a capacitor 230 mounted on the outer surface 2524 of the up lead frame 250, in which the capacitor 230 has a first capacitor electrode 232 and a second capacitor electrode 234 electrically connected with the up lead frame 250 respectively, wherein the first source electrode 212 and the second drain electrode 224 are electrically connected with the second capacitor electrode 234 and the first capacitor electrode 232 respectively via the up lead frame 250.

Please continuously refer to FIG. 4. The MOSFET pair with a stack capacitor 200 may further comprise a molding compound 270 to protect the whole module. The molding compound 270 covers the bottom lead frame 240, the platform 252 of the up lead frame 250, the first MOSFET 210, the second MOSFET 220, and the capacitor 230, wherein the outer leads 254 of the up lead frame 250 are exposed to the molding compound 270. In one embodiment, the material of the molding compound 270 is epoxy resin.

Continuing the above description, in one embodiment, the bottom lead frame 240 or the up lead frame 250 may be a one-piece-form. In one embodiment, the material of the bottom lead frame 240 or the up lead frame 250 may be copper.

Please continuously refer to FIG. 4. The first capacitor electrode 232 and the second capacitor electrode 234 are electrically connected with the up lead frame 250 by solder 236 in the first embodiment. And in this embodiment, all of the electrical bonding for the first MOSFET 210 and the second MOSFET 220 with the bottom lead frame 240 and the up lead frame 250 are implemented by solder 260. However, there are several popular ways including solder, Ag epoxy, and gold balls to implement the electrical bonding for the first MOSFET 210 and the second MOSFET 220 with the bottom lead frame 240 and the up lead frame 250. The optimum way is depending on which one is simpler, easier, or cheaper for the various kinds of the MOSFET and lead frames.

Figure 5:
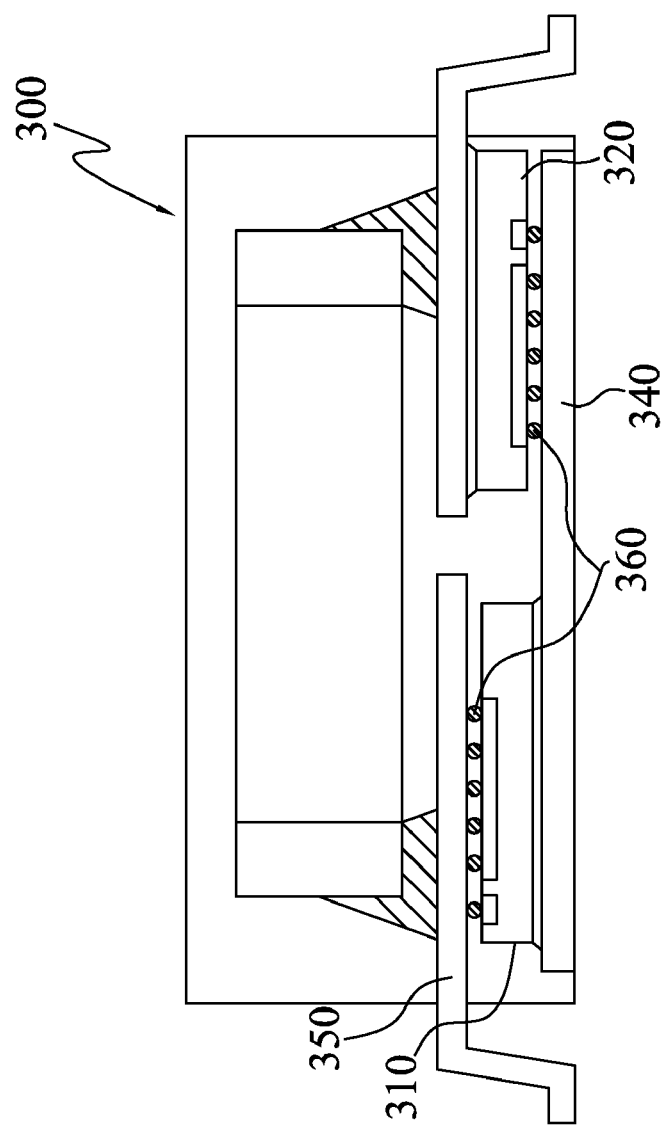
FIG. 5 is a cross-sectional schematic diagram to demonstrate the structure of the second embodiment of the present invention.

Therefore, the second embodiment of the present invention is described as follows. Please refer to FIG. 5, which is a cross-sectional schematic diagram to demonstrate the structure of the second embodiment of the present invention. Please simultaneously refer to FIG. 4, the difference between the structure of the second embodiment and the first one is that the MOSFET pair with a stack capacitor 300 of the former one (FIG. 5) adopts the gold balls 360 to electrically connect the first MOSFET 310 and the second MOSFET 320 with the up lead frame 350 and the bottom lead frame 340.

Figure 6:
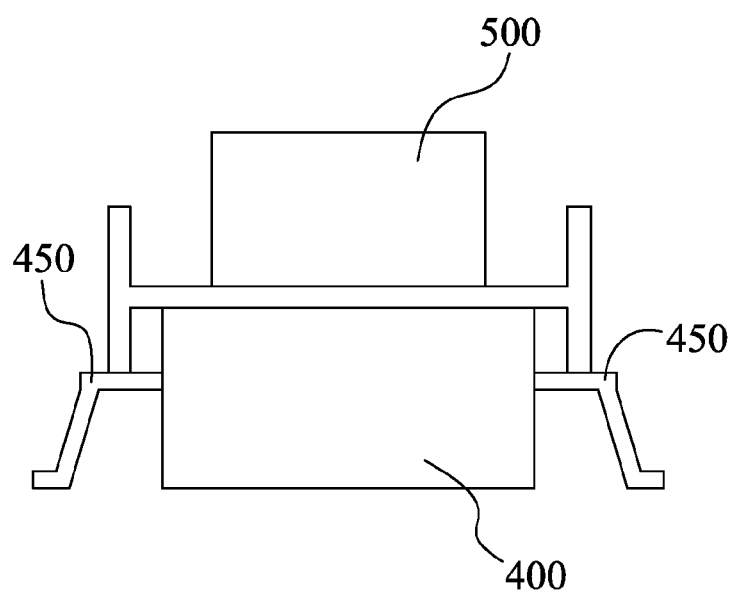
FIG. 6 is a schematic diagram to demonstrate one embodiment of the present invention.

Furthermore, the MOSFET pair with a stack capacitor of the present invention is suitable for extending to a more powerful SiP module because it has an up lead frame. Please refer to FIG. 6, which is a schematic diagram to demonstrate one embodiment of the present invention. A device 500 is stacked above the MOSFET pair with a stack capacitor 400 of the present invention, wherein the MOSFET pair with a stack capacitor 400 has an up lead frame 450. In one embodiment, the device 500 may be an IGBT, a diode, an inductor, a choke, or a heat sink.

To make a brief summary, one feature of the present invention is that the MOSFET pair with a stack capacitor of the present invention has an up lead frame, which has several advantages including: 1. The up lead frame may be a one-piece-form, so it has low inner impedance; 2. The input capacitor is directly mounted on the up lead frame, so the module has no parasitic inductance caused by the PCB and it has a optimized short EMI loop 280 (Please refer to FIG. 4.); 3. The thermal-dissipation ability of the module is excellent because the heat generated by two MOSFETs can simultaneously dissipate from the bottom lead frame and the up lead frame; and 4. The module has excellent extensibility because it can be stacked some other device, such as an IGBT, a diode, an inductor, a choke, and a heat sink above the up lead frame, to form a more powerful SiP module.

Besides, there are many advantages of the MOSFET pair with a stack capacitor according to the present invention, which includes: a. The module is wire-free bonding, so there is no parasitic inductance caused by the wires; b. The module has excellent structural flexibility because it can adopt solder, Ag epoxy, or gold balls to implement the electrical bonding of two MOSFETs with the bottom lead frame and the up lead frame.

Figure 7A:
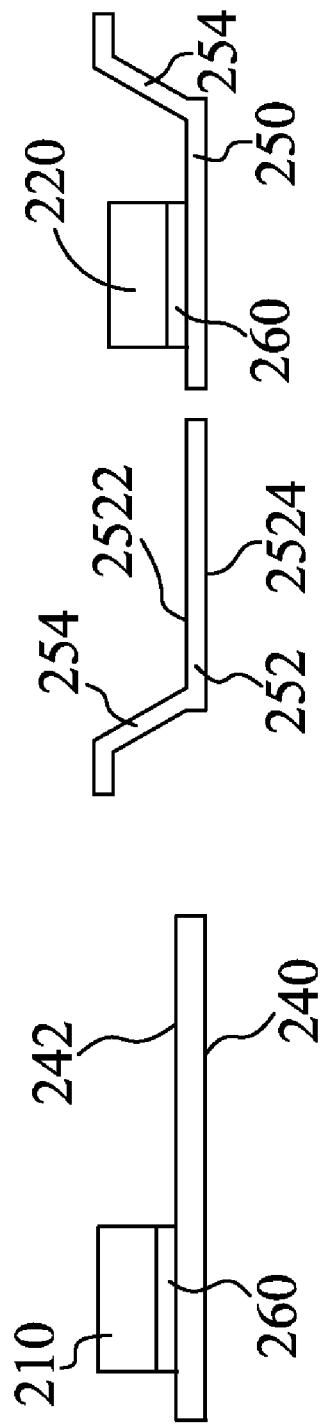
FIG. 7a to FIG. 7d are the schematic diagrams to demonstrate a method of manufacturing a MOSFET pair with a stack capacitor of the first embodiment.
Figure 7B:
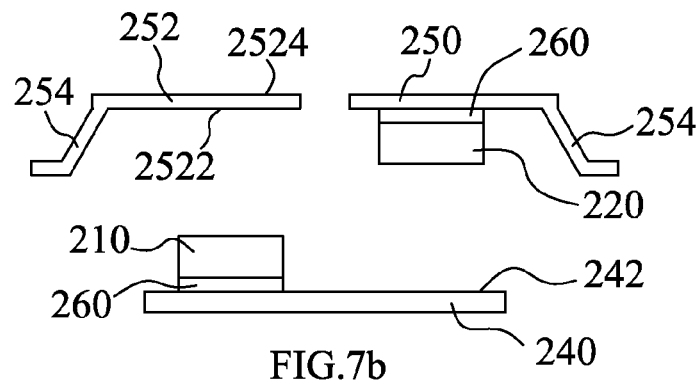
Figure 7C:
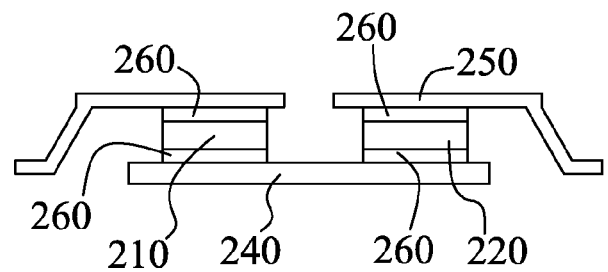
Figure 7D:
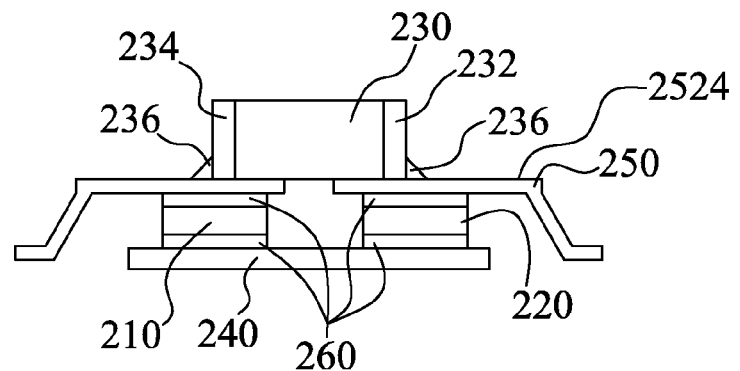

Next, a method of manufacturing a MOSFET pair with a stack capacitor of the first embodiment is described as follows. Please refer to FIG. 7a to FIG. 7d, which are the schematic diagrams to demonstrate a method of manufacturing a MOSFET pair with a stack capacitor of the first embodiment. And, please simultaneously refer to FIG. 4. The method comprises: providing a bottom lead frame 240 which has an up surface 242 (FIG. 7a); providing an up lead frame 250 which has a platform 252, and a plurality of outer leads 254, wherein the platform 252 has an inner surface 2522 and an outer surface 2524 (FIG. 7a); bonding a first MOSFET 210 on the up surface 242 of the bottom lead frame 240 (FIG. 7a); bonding a second MOSFET 220 on the inner surface 2522 of the up lead frame 250 (FIG. 7a); flipping the up lead frame 250 to make the inner surface 2522 of the up lead frame 250 face onto the up surface 242 of the bottom lead frame 240 (FIG. 7b); bonding the first MOSFET 210 with the up lead frame 250 (FIG. 7c); bonding the second MOSFET 220 with the bottom lead frame 240 (FIG. 7c); and bonding a capacitor 230 on the outer surface 2524 of the up lead frame 250 (FIG. 7d). The completed structure is shown in FIG. 4. Because it is easy to understand by simultaneous referring FIG. 4, the details of the electrodes and those electrical connections are not depicted in FIG. 7a to FIG. 7d and are not described in the above explanation.

Continuing the above description, in one embodiment, the step of bonding the first MOSFET 210 with the up lead frame 250 and the step of bonding the second MOSFET 220 with the bottom lead frame 240 may be executed separately or simultaneously.

In one embodiment, the method of manufacturing a MOSFET pair with a stack capacitor of the present invention may further comprise forming a molding compound 270 (Please refer to FIG. 4.) to cover the bottom lead frame 240, the platform 252 of the up lead frame 250, the first MOSFET 210, the second MOSFET 220, and the capacitor 230, wherein the outer leads 254 of the up lead frame 250 are exposed to the molding compound. Because it has been explained for FIG. 4 previously, it is not further described here.

Moreover, in one embodiment (Please refer to FIG. 6.), the method of manufacturing a MOSFET pair with a stack capacitor of the present invention may further comprise mounting a device 500 to stack above the up lead frame 450. Because it has been explained for FIG. 6 previously and it is easy for a person skilled in the art to be understood, it is not further described here.

Owing to other methods to manufacture the other embodiments of the present invention are similar to the above described method, they are not further described here.

To make a brief summary, the present invention provides a simple method to manufacture the MOSFET pair with a stack capacitor of the present invention. It is time-saving, flexible, cost-effective, and facile.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A MOSFET pair with a stack capacitor, comprising:
a bottom lead frame having an up surface;
an up lead frame having a platform, and a plurality of outer leads, wherein the platform has an inner surface and an outer surface;
a first MOSFET mounted between the inner surface of the up lead frame and the up surface of the bottom lead frame, wherein the first MOSFET has a first source electrode, a first drain electrode, and a first gate electrode, wherein the first source electrode and the first gate electrode are electrically connected with the up lead frame respectively, and the first drain electrode is electrically connected with the bottom lead frame;
a second MOSFET mounted between the inner surface of the up lead frame and the up surface of the bottom lead frame, wherein the second MOSFET is mounted besides the first MOSFET, and the second MOSFET has a second source electrode, a second drain electrode, and a second gate electrode, wherein the second source electrode and the second gate electrode are electrically connected with the bottom lead frame respectively, and the second drain electrode is electrically connected with the up lead frame; and
a capacitor mounted on the outer surface of the up lead frame, wherein the capacitor has a first capacitor electrode and a second capacitor electrode electrically connected with the up lead frame respectively, wherein the first source electrode and the second drain electrode are electrically connected with the second capacitor electrode and the first capacitor electrode respectively via the up lead frame.

2. The MOSFET pair with a stack capacitor according to claim 1, wherein the first source electrode and the first gate electrode are electrically connected with the up lead frame by solder, Ag epoxy, or gold balls.

3. The MOSFET pair with a stack capacitor according to claim 1, wherein the first drain electrode is electrically connected with the bottom lead frame by solder, Ag epoxy, or gold ball.

4. The MOSFET pair with a stack capacitor according to claim 1, wherein the second source electrode and the second gate electrode are electrically connected with the bottom lead frame by solder, Ag epoxy, or gold balls.

5. The MOSFET pair with a stack capacitor according to claim 1, wherein the second drain electrode is electrically connected with the up lead frame by solder, Ag epoxy, or gold ball.

6. The MOSFET pair with a stack capacitor according to claim 1, wherein the capacitor is mounted by solder.

7. The MOSFET pair with a stack capacitor according to claim 1, wherein the up lead frame is a one-piece-form.

8. The MOSFET pair with a stack capacitor according to claim 1, wherein the material of the up lead frame is copper.

9. The MOSFET pair with a stack capacitor according to claim 1, wherein the bottom lead frame is a one-piece-form.

10. The MOSFET pair with a stack capacitor according to claim 1, wherein the material of the bottom lead frame is copper.

11. The MOSFET pair with a stack capacitor according to claim 1, further comprising a molding compound to cover the bottom lead frame, the platform of the up lead frame, the first MOSFET, the second MOSFET, and the capacitor, wherein the outer leads of the up lead frame are exposed to the molding compound.

12. The MOSFET pair with a stack capacitor according to claim 11, wherein the material of the molding compound is epoxy resin.

13. The MOSFET pair with a stack capacitor according to claim 1, further comprising a device stacked above the up lead frame.

14. The MOSFET pair with a stack capacitor according to claim 13, wherein the device comprises an IGBT, a diode, and a heat sink.

15. A method of manufacturing a MOSFET pair with a stack capacitor, comprising:
    providing a bottom lead frame which has an up surface;
    providing an up lead frame which has a platform, and a plurality of outer leads, wherein the platform has an inner surface and an outer surface;
    bonding a first MOSFET on the up surface of the bottom lead frame, wherein the first MOSFET has a first source electrode, a first drain electrode, and a first gate electrode, wherein the first drain electrode is electrically connected with the bottom lead frame;
    bonding a second MOSFET on the inner surface of the up lead frame, wherein the second MOSFET has a second source electrode, a second drain electrode, and a second gate electrode, wherein the second drain electrode is electrically connected with the up lead frame;
    flipping the up lead frame to make the inner surface of the up lead frame face onto the up surface of the bottom lead frame;
    bonding the first MOSFET with the up lead frame, wherein the first MOSFET is mounted between the inner surface of the up lead frame and the up surface of the bottom lead frame, and the first source electrode and the first gate electrode are electrically connected with the up lead frame respectively;
    bonding the second MOSFET with the bottom lead frame, wherein the second MOSFET is mounted between the inner surface of the up lead frame and the up surface of the bottom lead frame, and is mounted besides the first MOSFET, wherein the second source electrode and the second gate electrode are electrically connected with the bottom lead frame respectively; and
    bonding a capacitor on the outer surface of the up lead frame, wherein the capacitor has a first capacitor electrode and a second capacitor electrode, wherein the first capacitor electrode and the second capacitor electrode are electrically connected with the up lead frame respectively, wherein the first source electrode and the second drain electrode are electrically connected with the second capacitor electrode and the first capacitor electrode respectively via the up lead frame.

16. The method of manufacturing a MOSFET pair with a stack capacitor according to claim 15, wherein the step of bonding the first MOSFET with the up lead frame and the step of bonding the second MOSFET with the bottom lead frame are executed separately or simultaneously.

17. The method of manufacturing a MOSFET pair with a stack capacitor according to claim 15, wherein the first source electrode and the first gate electrode are electrically connected with the up lead frame by solder, Ag epoxy, or gold balls.

18. The method of manufacturing a MOSFET pair with a stack capacitor according to claim 15, wherein the first drain electrode is electrically connected with the bottom lead frame by solder, Ag epoxy, or gold ball.

19. The method of manufacturing a MOSFET pair with a stack capacitor according to claim 15, wherein the second source electrode and the second gate electrode are electrically connected with the bottom lead frame by solder, Ag epoxy, or gold balls.

20. The method of manufacturing a MOSFET pair with a stack capacitor according to claim 15, wherein the second drain electrode is electrically connected with the up lead frame by solder, Ag epoxy, or gold ball.

21. The method of manufacturing a MOSFET pair with a stack capacitor according to claim 15, wherein the capacitor is bonded by solder.

22. The method of manufacturing a MOSFET pair with a stack capacitor according to claim 15, wherein the up lead frame is a one-piece-form.

23. The method of manufacturing a MOSFET pair with a stack capacitor according to claim 15, wherein the material of the up lead frame is copper.

24. The method of manufacturing a MOSFET pair with a stack capacitor according to claim 15, wherein the bottom lead frame is a one-piece-form.

25. The method of manufacturing a MOSFET pair with a stack capacitor according to claim 15, wherein the material of the bottom lead frame is copper.

26. The method of manufacturing a MOSFET pair with a stack capacitor according to claim 15, further comprising forming a molding compound to cover the bottom lead frame, the platform of the up lead frame, the first MOSFET, the second MOSFET, and the capacitor, wherein the outer leads of the up lead frame are exposed to the molding compound.

27. The method of manufacturing a MOSFET pair with a stack capacitor according to claim 26, wherein the material of the molding compound is epoxy resin.

28. The method of manufacturing a MOSFET pair with a stack capacitor according to claim 15, further comprising mounting a device to stack above the up lead frame.

29. The method of manufacturing a MOSFET pair with a stack capacitor according to claim 28, wherein the device comprises an IGBT, a diode, and a heat sink.

* * * * *